(12) United States Patent
Schwarzenbach et al.

(10) Patent No.: US 7,094,668 B2
(45) Date of Patent: Aug. 22, 2006

(54) ANNEALING PROCESS AND DEVICE OF SEMICONDUCTOR WAFER

(75) Inventors: Walter Schwarzenbach, Saint Nazaire les Eymes (FR); Jean-Marc Waechter, Saint Vincent de Mercuze (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 170 days.

(21) Appl. No.: 10/716,612

(22) Filed: Nov. 20, 2003

(65) Prior Publication Data
US 2004/0137762 A1 Jul. 15, 2004

(30) Foreign Application Priority Data
Nov. 27, 2002 (FR) ................... 02 14864

(51) Int. Cl.
H01L 21/30 (2006.01)
H01L 21/46 (2006.01)
(52) U.S. Cl. .................. 438/458; 438/480; 438/799
(58) Field of Classification Search .......... 438/458, 438/455, 459, 479–480, 798–799
See application file for complete search history.

(56) References Cited

U.S. PATENT DOCUMENTS

| | | | | |
|---|---|---|---|---|
| 5,616,264 A * | 4/1997 | Nishi et al. | ............. | 219/494 |
| 5,985,742 A | 11/1999 | Henley et al. | ............. | 438/515 |
| 5,994,207 A | 11/1999 | Henley et al. | ............. | 438/515 |
| 6,010,579 A | 1/2000 | Henley et al. | ............. | 148/33.2 |
| 6,013,563 A | 1/2000 | Henley et al. | ............. | 438/458 |
| 6,013,567 A | 1/2000 | Henley et al. | ............. | 438/515 |
| 6,033,974 A | 3/2000 | Henley et al. | ............. | 438/526 |
| 6,035,101 A | 3/2000 | Sajoto et al. | ............. | 392/416 |
| 6,048,411 A | 4/2000 | Henley et al. | ............. | 148/33.5 |
| 6,146,979 A | 11/2000 | Henley et al. | ............. | 438/458 |
| 6,155,909 A | 12/2000 | Henley et al. | ............. | 451/39 |
| 6,159,824 A | 12/2000 | Henley et al. | ............. | 438/455 |
| 6,159,825 A | 12/2000 | Henley et al. | ............. | 438/460 |
| 6,162,705 A | 12/2000 | Henley et al. | ............. | 438/478 |
| 6,187,110 B1 | 2/2001 | Henley et al. | ............. | 148/33.2 |
| 6,245,161 B1 | 6/2001 | Henley et al. | ............. | 148/33.4 |
| 6,284,631 B1 | 9/2001 | Henley et al. | ............. | 438/526 |
| 6,290,804 B1 | 9/2001 | Henley et al. | ............. | 156/344 |
| 6,291,313 B1 | 9/2001 | Henley et al. | ............. | 438/458 |
| 6,294,814 B1 | 9/2001 | Henley et al. | ............. | 257/347 |
| 6,335,264 B1 | 1/2002 | Henley et al. | ............. | 438/460 |
| 6,391,740 B1 | 5/2002 | Cheung et al. | ............. | 438/455 |
| 6,458,672 B1 | 10/2002 | Henley et al. | ............. | 438/478 |

(Continued)

FOREIGN PATENT DOCUMENTS

EP 0 291 147 A1 3/1988

(Continued)

OTHER PUBLICATIONS

Lin, Chin-Teng, et al., Temperature control of rapid thermal processing system using adaptive fuzzy network, *Fuzzy Sets and Systems*, vol. 103, pp. 49-65 (1999).

*Primary Examiner*—Thanhha Pham
(74) *Attorney, Agent, or Firm*—Winston & Strawn LLP

(57) ABSTRACT

A device and method for annealing a wafer. The preferred embodiment includes applying a basic thermal budget to a weakened zone of a wafer, substantially evenly over the weakened zone. The basic thermal budget is insufficient to detach a detachment layer from a remainder of the wafer at the weakened zone. An additional thermal budget is applied locally in an initiation region of the weakened zone to initiate the detachment of the detachment layer at the weakened zone.

28 Claims, 3 Drawing Sheets

U.S. PATENT DOCUMENTS

| | | | |
|---|---|---|---|
| 6,486,041 B1 | 11/2002 | Henley et al. | 438/458 |
| 6,511,899 B1 | 1/2003 | Henley et al. | 438/515 |
| 6,528,391 B1 | 3/2003 | Henley et al. | 438/459 |
| 6,558,802 B1 | 5/2003 | Henley et al. | 428/446 |
| 2001/0035124 A1* | 11/2001 | Okayama et al. | 118/110 |
| 2002/0055266 A1 | 5/2002 | Henley et al. | 438/737 |
| 2002/0056519 A1 | 5/2002 | Henley et al. | 156/344 |
| 2002/0081823 A1 | 6/2002 | Cheung et al. | 438/455 |
| 2002/0106870 A1 | 8/2002 | Henley et al. | 438/464 |
| 2002/0115264 A1 | 8/2002 | Henley et al. | 438/458 |

FOREIGN PATENT DOCUMENTS

| | | |
|---|---|---|
| EP | 1 256 973 A1 | 4/2001 |
| EP | 1 100 127 A1 | 5/2001 |
| EP | 1 258 909 A2 | 5/2002 |
| WO | WO 99/49501 | 9/1999 |
| WO | WO 01/63002 A1 | 8/2001 |

* cited by examiner

ANNEALING PROCESS AND DEVICE OF SEMICONDUCTOR WAFER

FIELD OF THE INVENTION

The present invention relates to a process and device for thermally annealing a wafer of a semiconductor material for detaching a layer from the wafer at an weakened zone or zone of weakness.

BACKGROUND OF THE INVENTION

Wafers are known to be made of a semiconductor material, such as silicon. The SMART-CUT® process, for instance, is known for annealing and detaching a layer from such a wafer at a zone of weakness, is an example of a process implementing such stages. The surface of layers produced are desired to satisfy very strict specifications. It is common to find roughness specifications that must not exceed 5 Angstroms in terms of rms (root mean square).

Measurements of roughness are generally taken with an AFM (Atomic Force Microscope). With this type of device, the roughness is measured on surfaces scanned by the tip of the AFM, ranging from $1\times1$ µm$^2$ to $10\times10$ µm$^2$, and less commonly to $50\times50$ µm$^2$ or even $100\times100$ µm$^2$.

It is also possible to measure the surface roughness by other methods, such as via a "haze". This method notably has the advantage of quickly characterising the harmony of the roughness over a whole surface. The haze, which is measured in ppm, comes from a process using the optical reflective properties of the surface to be characterized, and corresponds to an optical "background noise" diffused by the surface due to its micro-roughness.

It is also to be noted that if the layers are to have certain roughness values, they should also have a harmonious roughness over their whole surface.

The processes known in the art that allow the detachment of a layer from a wafer of semiconductor material following an annealing do not always result in layer surface roughness that falls within the aforementioned specifications. There is thus a need to improve the controlling of the roughness of detached layers following an annealing.

SUMMARY OF THE INVENTION

The invention relates to a device and a method for annealing a wafer and detaching a layer therefrom. In the preferred embodiment of the method, a basic thermal budget is applied to a weakened zone of a wafer substantially evenly thereover. The basic thermal budget is insufficient to detach a detachment layer from a remainder of the wafer at the weakened zone. An additional thermal budget is applied locally in an initiation region of the weakened zone in which the basic thermal budget is applied. Preferably, the basic thermal budget is just slightly below the thermal budget needed for effecting the detachment and is sufficient high such that the application of the additional thermal budget initiates the detachment in the initiation region, and causes the detachment to propagate throughout the weakened zone from the initiation region. The preferred weakened zone extends through a crystalline layer of the wafer, which can comprise a semiconductor material.

In the preferred embodiment, a plurality of heating elements cooperate to provide different amounts of heat to substantially evenly apply the basic thermal budget. Preferably, the thermal budget is applied with the wafer in substantially vertical orientation, although the wafer can be positioned in other orientations, including horizontally. The operation of the heating elements is preferably selected to counteract effects that can cause concentrated heating in certain areas compared to others in the weakened zone.

The basic thermal budget can be applied before the application of the additional thermal budget, or it can be applied concurrently therewith. Preferably, a plurality of wafers are annealed in a same batch, and the basic and thermal budgets can be applied simultaneously.

A heat-conducting gas is preferably caused a flow over the wafer being annealed. The flow is controlled over a plurality of regions of the wafer in the preferred embodiment for applying the even basic thermal budget. The flow of heat conducting gas can be controlled, for example, by flowing the gas across a diffusion barrier damper to the wafer or a perforated heating chamber damper in which the wafer is placed.

The preferred annealing device of the present invention includes a positioner that is configured for holding one or more of the wafers that have weakened zones to facilitate the detachment of the detachment layer adjacent thereto. A heating assembly is configured for applying the basic and additional thermal budgets. Preferably, heating elements are disposed adjacent to different portions of the wafer and a controller assembly is operably associated with the heating elements for controlling the heating of different heating elements to produce different amounts of heat, preferably to evenly apply the basic thermal budget.

The controller assembly can be operably associated with the heating elements for independently controlling the different heating elements. The heating assembly can include a gas feed for feeding a flow of heat-conducting gas for transferring heat to the wafer, as well as a gas control assembly configured for controlling the distribution of the gas flow in association with the wafer. The gas control assembly can include a diffusion damper to cause the gas to flow in a predetermined manner. The diffusion damper can include a perforated heating chamber in which the wafer is received for heating, or can include a diffusion barrier, for example.

The heating elements can extend generally horizontally and are preferably stacked in a generally vertical direction, such as with the positioner holding the wafer in a substantially vertical position for heating. The preferred heating elements substantially surround the wafer or wafers that are held by the positioner. Also, as indicated above, the positioner can be configured for holding the wafer substantially horizontally or in other orientations for heating in an alternative embodiment.

The invention thus provides a more effective way of applying thermal budgets and detaching a thin layer from donor wafer, such as for transferring a thin layer to a receiving support substrate. The thickness of these layers transferred is typically on the order of a few hundreds or tens of nanometers. The detachment can be followed by surface treatments to further decrease the roughness of the exposed surfaces of the attached thin layer, and further steps can be carried out on this layer, such as epitaxially growing additional layers thereon after the detachment. These processes can be carried out in the manufacture of, for example, electronic or optoelectronic components.

BRIEF DESCRIPTION OF THE DRAWINGS

Other aspects, aims and advantages of the invention will become clearer upon reading the description below of preferable embodiments of the invention, given in reference to the annexed drawings in which.

DETAILED DESCRIPTION OF THE PREFERRED EMBODIMENT

Figure 1:
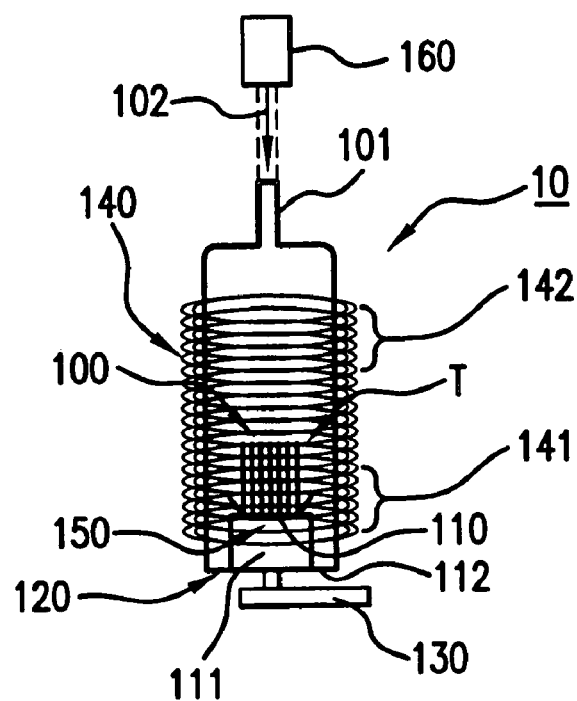
FIG. 1 is a diagrammatic view of an embodiment of an annealing device constructed according to the invention.

The invention provides improved control of the roughness of a detached layer, and provides a thermal annealing process for a wafer of material chosen from among the semiconductor materials, for detaching a layer from the wafer at an weakened or weakened zone. Preferably, during annealing:

a basic thermal budget is applied to the wafer, the basic thermal budget being slightly inferior to the budget necessary to detach the layer, this budget preferably being distributed in an even or substantially even manner over the weakened zone;

an additional thermal budget is also applied to the wafer locally in a predetermined region of the weakened zone so as to initiate the detachment of the layer in this region.

Additional preferred and non-restrictive aspects of this process are the following:

during the application of a global thermal budget, different heating elements that are located facing the wafer are selectively controlled;

the wafer can be placed substantially vertically, horizontally, or in another suitable orientation;

the application of a basic thermal budget is carried out in a first stage; then an application of an additional localized thermal budget is carried out in a second stage;

the application of a basic thermal budget is carried out substantially simultaneously with the application of an additional localized thermal budget;

annealing is applied simultaneously to several wafers;

the flow of heat conducting gas is controlled in the different regions of the surface of the layer;

the control of the heat conducting gas is carried out using a damper, such as with a diffusion barrier geometry or perforated heating chamber geometry.

The invention also provides a device for the implementation of the inventive process. The preferred device includes:

heating elements configured and arranged to face different parts of each wafer to be annealed;

a heating control selectively control the heating power produced by each heating element;

a distribution controller controlling the distribution of heat conducting gas in the device;

In the preferred device, several preferred and non-restrictive features are the following: the heating elements extend substantially horizontally;

the heating elements extend substantially horizontally;

the heating elements have a general circular, rounded, or other closed shape;

the heating elements are positioned in a substantially vertical series;

the device comprises a wafer reception area into which the wafers are placed in a substantially vertical orientation for heating;

the heating elements surround the wafer reception area;

the heating elements extend substantially in parallel planes;

the heating elements extend substantially concentrically in relation to each other;

the device comprises a wafer reception area into which the wafers are placed in a substantially horizontal orientation for heating;

the distribution control has a diffusion damper enabling the flow of gas to be provoked according to a desired configuration, placed facing an opening enabling heat conducting gas to be introduced;

the damper has a diffusion barrier geometry;

the damper has a perforated heating chamber geometry;

In reference to FIG. 1, a first embodiment of an annealing device constructed according to the invention is shown. It is noted that the wafers used are preferably made of a semiconductor material, such as silicon, and include a weakened zone, produced as known in the art.

The weakened zone, for instance, can be created via implantation of atomic species at a predetermined depth in the wafer. The weakened zone preferably extends in the thickness of the wafer at a substantially constant depth, thus preferably along an internal surface parallel to the faces of the wafer to define a layer to be detached.

In general, the annealing used with the present invention can be part of a process of the SMART-CUT® type. The purpose of annealing in this type of process is to aid in the detachment of the layer of material defined in the thickness of the wafer by the weakened zone in each wafer.

The device 10 in FIG. 1 includes a heating chamber 100 configured to receive one or more wafers T to subject them to annealing according to the invention. The longitudinal axis of the device 10 is generally upright and preferably substantially vertical. Device 10 thus resembles a vertical oven.

Wafers T are placed preferably substantially vertically in chamber 100, instead of horizontally. The wafers are received in a holder, such as boat 110, which in turn is supported by a support 111. The support 111 sits on a lid 112 which closes fire hole 120 of the device 10. Handler 130 is configured for handling the wafers T and for introducing the wafers T into the device 10 and retracting them after annealing. Additionally, the chamber 100 is provided with an opening 101 located opposite the fire hole 120. A heat conducting gas 102 can be introduced into the chamber 100 via this opening 101.

A plurality of heating elements 140 preferably surround the chamber 100. These heating elements 140 are disposed one after the other in series in a substantially vertical direction.

Heating elements 140 can be electrodes, for example, capable of emitting heat when they are supplied with electricity.

The preferred device 10 also includes a rotating mechanism 150 associated with the boat 110 for rotating the boat 110 that is supporting the wafers T around the longitudinal axis of the device 10 during annealing. Additionally, a flow controller 160 for controlling and regulating the flow of heat conducting gas 102. The rotating mechanism 150 and flow controller 160 contribute to providing an even heating of the wafers, corresponding to the basic thermal budget explained below.

Figure 2:
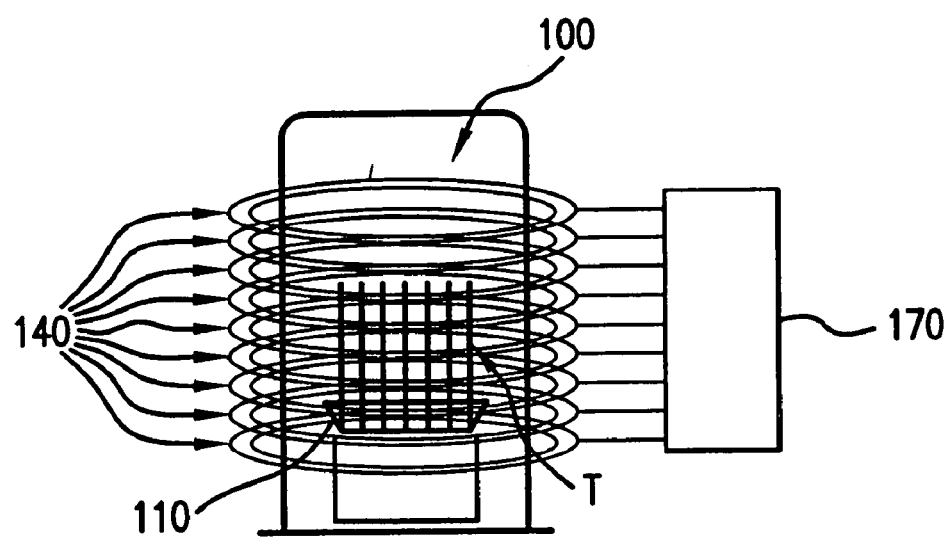
FIG. 2 is a diagrammatic view of certain elements associated with a heating chamber thereof.

FIG. 2 provides an enlarged view of certain aspects of the chamber 100, the wafers T, and the heating elements 140. A smaller number of heating elements 140 than is preferred is shown in the figures for the purpose of clarity. A heating controller 170 is associated with the heating elements 140 preferably for selective controlling of the electric supply of each heating element 140, so as to selectively control the heat provided by each of these heating elements 140. In this manner, the vertical distribution of the thermal budget applied to the wafers during heating can be controlled.

Figure 3:
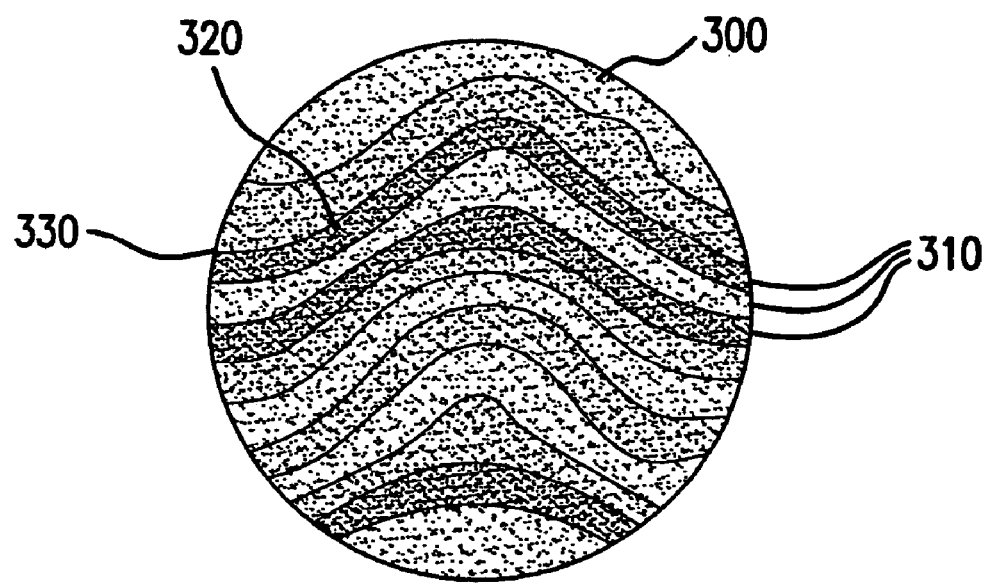
FIG. 3 is a representation of the distribution of haze on the surface of a layer produced, according to the prior art.

A typical vertical oven into which wafers are placed vertically, however, produces vertical temperature gradients. After the detachment of the layer from each wafer, such gradients result in a vertical gradient of roughness on the surface of the detached portions of the wafer that has a negative effect on the evenness of the surface of the layer. The roughness is distributed generally in horizontal strata or plies 310 in these typical vertical ovens, the roughness valves are not even across the surface of the detached layer (on the part of the wafer located on the opposite side of the weakened zone). Such an effect is shown in FIG. 3.

In a preferred embodiment, it is possible to selectively control groups of heating elements to have a same set value for the heating temperature desired. This is for example the case in an embodiment in which the heating elements are configured as coils disposed adjacent to each other.

In this configuration, the electric supplies to each coil can be individually controlled or the respective electric supply of different groups of coils can be independently controlled.

If groups of coils are controlled due to the closeness of the coils, there can exist a hotter zone within the group of coils supplied with electrical power in a same manner or with the same power (this hotter zone being typically in the middle of the group, not taking into account the neighbouring groups of coils). According to the invention such hot zones of the device can be exploited, for example to apply an additional and localized thermal budget, as explained below. By selectively controlling the electric supply of the heating elements 140 the space distribution of the thermal budget applied to the wafers can be controlled.

It is also to be noted in FIG. 3 that the strata or plies 310 are not straight bands, but have a complex shape.

This shape is due to the effect of a difference of thermal budget between that applied to the central region 320 of the wafer and to its side edges 330.

It is also possible to selectively control the flow rate distribution of conducting gas 102 in a horizontal section of the oven, so as to apply this gas flow rate to different areas of the section with the aim of cancelling out this unevenness observed on a horizontal section of the wafer. This selective controlling of the flow rate distribution of conducting gas 102 can be carried out as a complement of the selective controlling of the electric supply of the heating elements 140 described above. Thus, generally speaking and as detailed below, the space distribution of the thermal budget applied to the wafers T is controlled via the selective controlling of the electric supply of the different heating elements 140, and/or via the selective controlling of the flow rate distribution of heat conducting gas 102 on the surface of the wafers T.

It is thus possible to apply to the wafers T a thermal budget that is substantially evenly spaced out over substantially the entire weakened zone of each wafer. Preferably, the thermal budget is substantially evenly spread out over at least ⅔ of the weakened zone, more preferably at least ¾, and most preferred over at least 90% thereof. This can be visualised for example via haze measurements taken on the surface of the layers after their detachment.

To perform an even budget application to wafers T in a type of device 10 as shown in FIGS. 1 and 2, the lower heating elements 141 are typically supplied with more electricity than the upper elements 142.

This compensates for the natural tendency of heat to rise in the chamber 100, which tends to generate higher temperatures in the upper part of this chamber. In this way, the thermal budget applied to the wafers T can be even over the entire weakened zone of each wafer T.

More generally speaking, the selective controlling of the individual electric supplies of the different heating elements 140 enables the precise controlling of the space distribution of the thermal budget applied to the wafers T. This controlling of the space distribution of the thermal budget applied to the wafers is to:

apply to the wafers T a thermal budget that is very even over the entire weakened zone of each wafer. This thermal budget (known as basic thermal budget) is controlled so as to be:

from a qualitative point of view, highly evenly spaced out over the weakened surface of each wafer;

from a quantitative point of view, slightly inferior to the budget necessary to detach the layer from the wafer.

in addition, to the basic thermal budget, apply an additional thermal budget controlled so as only to be applied to a localized area of each wafer to create a controlled "hot point". This additional thermal budget can be applied for example by selectively supplying electricity to one or more heating elements, and adding to the aforementioned measures so as to obtain a homogeneous heating of the wafers. It is also possible to use a special distribution of temperature in the annealing device 10, for example by controlling the gas flow, so as to apply the additional thermal budget.

These two applications of controlled thermal budget can be carried out sequentially one after the other, or substantially simultaneously. The global thermal budget thus applied to the wafers (standard budget+additional budget) is therefore different to that which would be obtained if the wafers were heated in a traditional vertical oven in which the wafers are placed vertically. Indeed, in that case the thermal budget would have a vertical gradient, as described above. The global thermal budget thus corresponds to a thermal budget can if desired have a localized hot point, such as in an area of the weakened zone, but preferably is free of variations that are spread over a large part of this zone (for example over at least half of a characteristic quantity of this zone—this quantity typically being its diameter in the case of a weakened zone in the shape of a disk).

Figure 4:
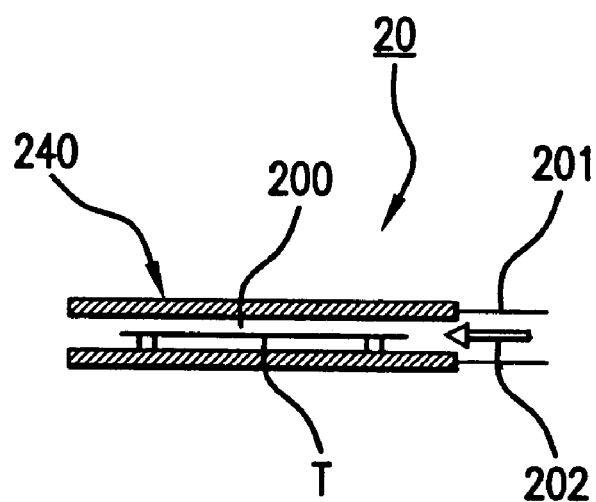
FIG. 4 is a diagrammatic view of another embodiment of an annealing device.

The device 10 of FIGS. 1 and 2 corresponds to a preferred embodiment of an annealing device according to the invention. It is, however, also possible to carry out such an even application of a global thermal budget in other embodiments. FIG. 4 shows a device 20 that is capable of performing an annealing process according to the invention on a wafer T or on a plurality of wafers.

The wafer(s) T extends substantially horizontally, in a heating chamber 200. The chamber 200 is provided with an opening 201 for the introduction of heat conducting gas 202.

It is to be noted that the simplified representation in FIG. 4 shows a single opening 201 for the introduction of heat conducting gas 202, although it is preferred to configure the opening 201 and its association with chamber 200 to ensure that the flow of this gas on the surface of the wafer(s) T does not generate undesired unevenness in the thermal budgets absorbed by the different zones of the surface of each wafer (T). In this regard, one embodiment has several openings 201 for the introduction of heat conducting gas, with these openings regularly around the periphery of the device.

It is also possible, as an alternative or in addition, to place on the inside of the device, facing the opening 201 (or each opening 201), diffusion dampers 220 enabling the gas to flow according to a desired configuration. Such dampers 220 thus guarantee that the flow of gas is harmonious and generally evenly distributed over the surface of the wafer T.

Figure 5A:
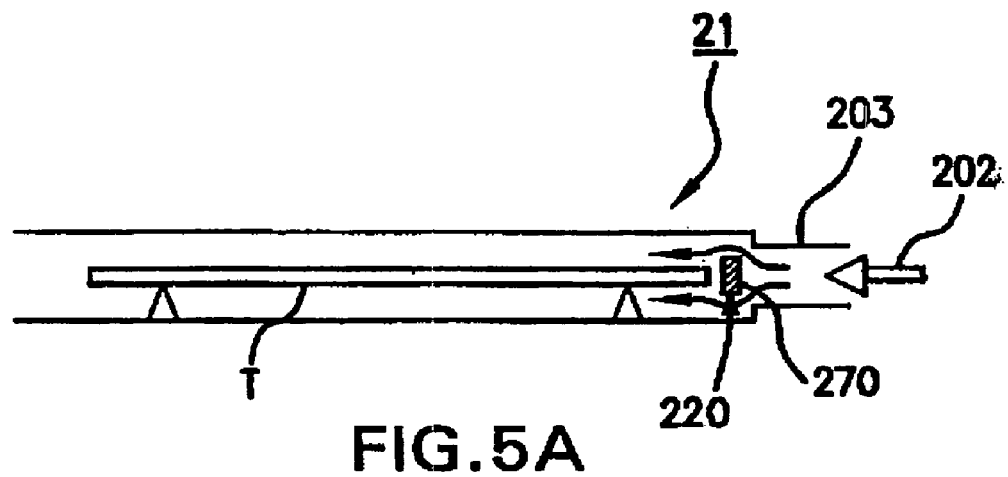
FIGS. 5a–5c are diagrammatic views of annealing device embodiments, showing different ways of orienting a flow of heat conducting gas.
Figure 5B:
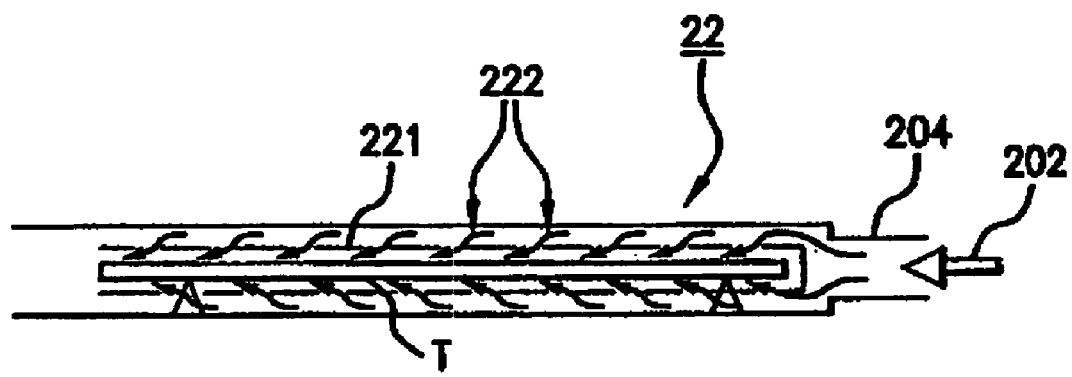
Figure 5C:
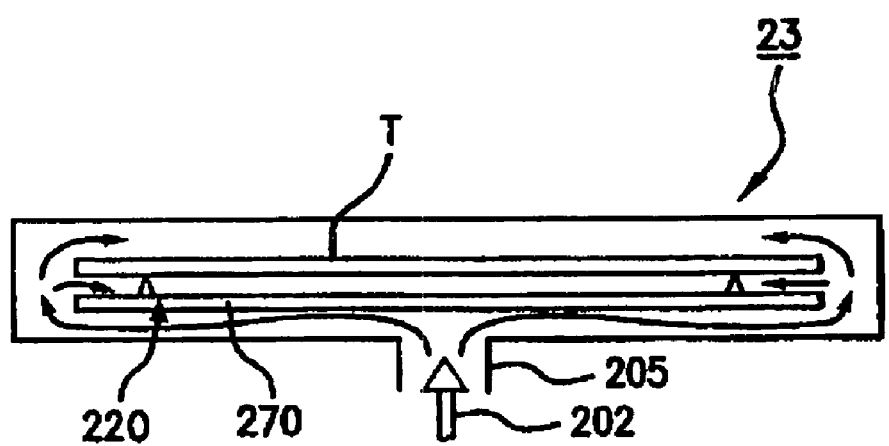

Such dampers 220 can have different geometries, for example:

a diffusion barrier 270 geometry interposed between the gas 202 and the wafers T, meaning that the gas 202 must go around the diffusion barrier 270 prior to flowing over the wafers (this type of configuration is illustrated in FIGS. 5a and 5c).

a perforated chamber 221 geometry surrounding the wafers, the openings 222 of which allow the gas 202 to flow towards and over the wafers T (FIG. 5b).

In the preferred embodiments, including in a horizontal and vertical oven embodiments, and embodiments holding the wafers in other orientations, it is possible to control the thermal budget applied to the wafers via two principal means:

the individual controlling of different heating elements; and the controlling of the flows of heat conducting gas on the different regions of the surface of the wafer(s) T.

The devices 20-23 comprise heating elements collectively designated in FIG. 4 by the reference 240. These heating elements 240 can be placed exclusively above the wafers, but it is also possible to double them up via similar heating elements located under the wafers T, for instance.

The heating elements 240 can include a series of individual heating elements, for example electrodes, that extend along a horizontal plane. Each heating element can be a circular element placed concentrically in relation to the other elements, with the different elements having different diameters. These concentric elements are thus also placed concentrically in relation to the wafers T when the wafers T latter are in the annealing position.

Controllers for selective and individual controlling of each heating element can be avoided. This can produce global thermal budget applied to the wafers as described above.

The heating elements 240 can also include a single electrode of "hot plate" type in which it is possible to control the distribution of temperature. It is also possible to replace the elements 240 with controlled infrared lamps whose respective electric supplies are preferably individually controlled.

Different types of heating units can be combined. For instance, elements 240 of electrode type, such as in the shape of concentric circular elements, can be combined with infrared lamps that provide supplementary heat capable of:

locally adjusting the thermal budget applied to the weakened zone so as to constitute an even basic thermal budget; and also selectively creating a hot point or area in this weakened zone by locally applying an additional thermal budget.

Preferably, the heating device is capable of carrying out a harmonious and even heating of the wafers so as to apply an even basic thermal budget to the weakened zone of these wafers, while being able to apply a higher thermal budget to a particular region of the weakened zone, by creating a "hot point" or area in the weakened zone. Preferably, only a single hot point is produced in one weakened area. This can be obtained preferably either by:

individually controlling one or more heating elements so as to create the hot point via the localized increasing of the heating, such as at a specific time during annealing or throughout annealing.

according to an alternative embodiment, by exploiting the thermal configuration of the annealing device of the wafers in question, such as by exploiting a particular flow of heating gas.

In addition, when the heating elements are controlled so as to apply an even thermal budget to the weakened zones of the wafers, they create a hot point in the weakened zones, it is possible to use this hot point during the annealing process so as to apply the desired additional budget.

While operating, the annealing device thus preferably applies an even basic thermal budget to the weakened zone of the wafers. More precisely, this basic thermal budget corresponds to an energetic budget slightly inferior to the budget necessary to detach the layer from the wafer. More precisely, this basic thermal budget corresponds to an energetic budget slightly inferior to the budget necessary to detach the layer from the wafer.

The even, basic thermal-budget is applied so as to reach a budget slightly inferior to that which is necessary to carry out the detachment of the layer from each wafer.

In this regard, the localized region having received the additional thermal budget corresponds to a zone in which the detachment of the layer is initiated. In this initiating zone, the weakened zone of each wafer has received the basic thermal budget per surface unit as well as the additional thermal budget. For each wafer, the sum of these two thermal budgets is sufficient to locally initiate the detachment of the layer from the wafer in the part of the weakened zone that corresponds to the initiating zone.

This detachment thus preferably propagates through the rest of the weakened zone, which has received, per surface unit, a thermal budget slightly inferior to that needed to carry out the detachment. In these conditions, the propagation of the initial detachment preferably is sufficient to propagate the complete detachment of the layer.

This detachment thus preferably propagates over the entire surface of the weakened zone, which leads to the complete detachment of the layer. The applicant has determined that proceeding in this manner leads to more even, homogeneous, and lower roughness values compared with traditional methods in which a preferably even thermal budget is applied to a wafer weakened-zone, and in which the even thermal budget has a value sufficient to detach of the layer.

The local application of an additional thermal budget to create a hot point can be carried out in a constant manner throughout annealing, for instance. In this case, the standard budget and the additional budget are applied substantially simultaneously to the wafers. It is alternatively possible to carry out this local application during a specific stage of the annealing process, for example at the end of annealing. It is also possible to treat a plurality of wafers simultaneously according to the invention.

While illustrative embodiments of the invention are disclosed herein, it will be appreciated that numerous modifications and other embodiments may be devised by those skilled in the art. For example, while in the preferred embodiment a strained silicon film 3 in transferred, other types of films of a semiconductor able to be strained and transferred can be transferred according to a process of the invention. Additionally, in the semiconductor layers, other constituents may be added thereto, such as carbon with a carbon concentration in the layer in question of less than or equal to about 50% or more preferably with a concentration of less than or equal to about 5%. Therefore, it will be understood that the appended claims are intended to cover all such modifications and embodiments that come within the spirit and scope of the present invention.

The invention claimed is:

1. A method of annealing a wafer, comprising:
    substantially evenly applying a homogeneous and even basic thermal budget over at least ⅔ of a weakened zone of the wafer, the basic thermal budget being insufficient to detach a detachment layer from a remainder of the wafer at the weakened zone; and
    applying an additional thermal budget locally in an initiation region of the weakened zone in which the basic thermal budget is applied for initiating detachment of the detachment layer at the weakened zone.

2. The method of claim 1, wherein the weakened zone extends through a crystalline layer of the wafer.

3. The method of claim 2, wherein the wafer comprises a semiconductor material.

4. The method of claim 1, wherein a plurality of heating elements are operated to provide different amounts of heat to substantially evenly apply the basic thermal budget.

5. The method of claim 4, wherein the basic thermal budget is applied to the wafer in a substantially vertical orientation.

6. The method of claim 4, wherein the basic thermal budget is applied to the wafer in a substantially horizontal orientation.

7. The method of claim 1, wherein the basic thermal budget is applied before the application of the additional thermal budget.

8. The method of claim 1, wherein the basic and additional thermal budgets are applied in a concurrent application.

9. The method of claim 8, further comprising applying the basic and additional thermal budgets to the wafer and simultaneously to additional wafers.

10. The method of claim 1, further comprising flowing a heat conducting gas over the wafer and controlling the flow over a plurality of regions on the wafer for said substantially evenly applying the basic thermal budget.

11. The method of claim 10, wherein the flow of heat conducting gas is controlled by flowing the gas across a diffusion barrier damper to the wafer.

12. The method of claim 10, wherein the flow of heat conducting gas is controlled by flowing the gas across a perforated heating chamber damper to the wafer.

13. The method of claim 1, wherein the basic thermal budget is sufficiently high such that the application of the additional thermal budget causes the detachment to propagate through the weakened zone.

14. The method of claim 1, wherein the basic and additional thermal budgets are applied while the wafer is present in a wafer annealing device comprising a positioner configured for holding the wafer; and a heating assembly configured for applying the basic and additional thermal budgets.

15. The method of claim 14, wherein the heating assembly comprises:
    a plurality of heating elements disposed adjacent different portions of the wafer; and
    a controller assembly operably associated with the heating elements for controlling the heating of different heating elements to produce different amounts of heat to substantially evenly apply the basic thermal budget.

16. The method of claim 15, wherein the controller assembly is operably associated with the heating elements for independently controlling the different heating elements.

17. The method of claim 15, wherein the heating assembly comprises:
    a gas feed for flowing a heat conducting gas for transferring heat to the wafer; and
    a gas control assembly configured for controlling the distribution of the gas flow in association with the wafer.

18. The method of claim 17, wherein the gas control assembly comprises a diffusion damper configured to cause the gas to flow in a predetermined configuration.

19. The method of claim 18, wherein the diffusion damper comprises a diffusion barrier or a perforated heating chamber in which the wafer is received for heating.

20. The method of claim 15, wherein the heating elements extend generally horizontally and are stacked in a generally vertical direction.

21. The method of claim 20, wherein the positioner is configured for holding the wafer substantially vertically for heating.

22. The method of claim 20, wherein the heating elements substantially surround the wafer held by the positioner.

23. The method of claim 14, wherein the positioner is configured for holding the wafer substantially horizontally for heating.

24. The method of claim 1, wherein the basic and additional thermal budgets are applied to provide a reduced roughness on the detached detachment layer.

25. The method of claim 1, wherein the additional thermal budget is applied to provide a hot point within the weakened zone to initiate the detachment through the remainder of the weakened zone that has only the basic thermal budget.

26. The method of claim 1, wherein the basic thermal budget is substantially even over at least ¾ of the weakened zone.

27. The method of claim 1, wherein the basic thermal budget is substantially even over at least 90% of the weakened zone.

28. The method of claim 1, wherein the basic thermal budget is substantially even over substantially the entire weakened zone.

* * * * *